United States Patent
Sugo et al.

(10) Patent No.: US 10,242,902 B2
(45) Date of Patent: *Mar. 26, 2019

(54) WAFER PROCESSING LAMINATE, TEMPORARY ADHESIVE MATERIAL FOR WAFER PROCESSING, AND METHOD FOR MANUFACTURING THIN WAFER

(71) Applicant: SHIN-ETSU CHEMICAL CO., LTD., Tokyo (JP)

(72) Inventors: Michihiro Sugo, Takasaki (JP); Hiroyuki Yasuda, Tomioka (JP); Shohei Tagami, Annaka (JP); Masahito Tanabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/122,493

(22) PCT Filed: Mar. 3, 2015

(86) PCT No.: PCT/JP2015/001099
§ 371 (c)(1),
(2) Date: Aug. 30, 2016

(87) PCT Pub. No.: WO2015/141156
PCT Pub. Date: Sep. 24, 2015

(65) Prior Publication Data
US 2017/0069521 A1    Mar. 9, 2017

(30) Foreign Application Priority Data
Mar. 18, 2014 (JP) .................... 2014-055370

(51) Int. Cl.
*H01L 21/683* (2006.01)
*C09J 7/30* (2018.01)
(Continued)

(52) U.S. Cl.
CPC ........... *H01L 21/6836* (2013.01); *B32B 7/04* (2013.01); *B32B 7/06* (2013.01); *B32B 7/12* (2013.01);
(Continued)

(58) Field of Classification Search
CPC . C09J 183/04; C09J 7/203; C09J 7/201; C09J 7/205; C09J 7/30; C09J 7/401;
(Continued)

(56) References Cited

U.S. PATENT DOCUMENTS 3,528,940 A * 9/1970 Modic .................. C09J 183/04
524/493
3,983,298 A * 9/1976 Hahn .................... C09J 7/0207
428/355 RA
(Continued)

FOREIGN PATENT DOCUMENTS

CN 103180394 A 6/2013
CN 103403855 A 11/2013
(Continued)

OTHER PUBLICATIONS

Apr. 14, 2015 International Search Report issued in International Patent Application No. PCT/JP2015/001099.
(Continued)

*Primary Examiner* — Sophia Nguyen
(74) *Attorney, Agent, or Firm* — Oliff PLC

(57) ABSTRACT

A temporary adhesive material for a wafer processing, used for temporarily bonding a support and a wafer having a circuit-forming front surface and a back surface to be processed, contains a complex temporary adhesive material layer having a three-layered structure that includes a first temporary adhesive layer composed of a non-silicone thermoplastic resin layer capable of releasably adhering to the front surface of the wafer, a second temporary adhesive layer
(Continued)

composed of a thermosetting siloxane polymer layer laminated on the first temporary adhesive layer, and a third temporary adhesive layer composed of a thermosetting siloxane-modified polymer layer laminated on the second temporary adhesive layer and capable of releasably adhering to the support. A wafer processing laminate and temporary adhesive material for a wafer processing facilitate temporary adhesion and separation, have excellent CVD resistance, and can increase productivity of thin wafers, and a method manufactures a thin wafer using the same.

15 Claims, 1 Drawing Sheet

(51) Int. Cl.

| | |
|---|---|
| C09J 7/40 | (2018.01) |
| C09J 7/20 | (2018.01) |
| C09J 7/50 | (2018.01) |
| C09J 183/04 | (2006.01) |
| C08G 77/20 | (2006.01) |
| B32B 27/08 | (2006.01) |
| B32B 27/28 | (2006.01) |
| B32B 7/04 | (2019.01) |
| B32B 7/06 | (2019.01) |
| B32B 7/12 | (2006.01) |
| B32B 27/18 | (2006.01) |
| B32B 27/26 | (2006.01) |
| B32B 37/12 | (2006.01) |
| C08G 77/12 | (2006.01) |

(52) U.S. Cl.
CPC ............ *B32B 27/08* (2013.01); *B32B 27/18* (2013.01); *B32B 27/26* (2013.01); *B32B 27/283* (2013.01); *B32B 37/12* (2013.01); *C08G 77/20* (2013.01); *C09J 7/201* (2018.01); *C09J 7/203* (2018.01); *C09J 7/30* (2018.01); *C09J 7/401* (2018.01); *C09J 7/403* (2018.01); *C09J 7/50* (2018.01); *C09J 183/04* (2013.01); *H01L 21/6835* (2013.01); *B32B 2037/1269* (2013.01); *B32B 2250/03* (2013.01); *B32B 2264/00* (2013.01); *B32B 2264/02* (2013.01); *B32B 2307/732* (2013.01); *B32B 2307/748* (2013.01); *B32B 2405/00* (2013.01); *B32B 2457/08* (2013.01); *B32B 2457/14* (2013.01); *C08G 77/12* (2013.01); *H01L 2221/6834* (2013.01); *H01L 2221/68327* (2013.01); *H01L 2221/68386* (2013.01); *H01L 2224/13147* (2013.01); *H01L 2924/0715* (2013.01); *H01L 2924/10253* (2013.01)

(58) Field of Classification Search
CPC . C09J 7/403; C09J 7/50; C09J 7/1332; C08K 5/56; C08L 83/00; B32B 2457/14; B32B 27/08; B32B 27/283; B32B 27/12; B32B 27/26; B32B 7/12; B32B 2307/748; B32B 2037/1269; B32B 7/06; C08G 77/12; C08G 77/20; H01L 21/6835; H01L 21/6836; H01L 2221/68327; H01L 2221/6834; H01L 2221/68386; H01L 2224/13147; H01L 24/14; H01L 2924/0715
See application file for complete search history.

(56) References Cited

U.S. PATENT DOCUMENTS

| | | | | |
|---|---|---|---|---|
| 5,216,069 | A * | 6/1993 | Kobori | C09J 183/04 428/447 |
| 5,290,882 | A * | 3/1994 | Shiobara | C08G 59/3218 523/429 |
| 6,649,258 | B2 * | 11/2003 | Yamada | C08K 3/08 252/512 |
| 7,482,249 | B2 * | 1/2009 | Jakob | H01L 21/6836 438/460 |
| 7,534,498 | B2 * | 5/2009 | Noda | B32B 43/006 428/446 |
| 7,541,264 | B2 | 6/2009 | Gardner et al. | |
| 8,178,207 | B2 * | 5/2012 | Mizuno | C09J 183/04 428/447 |
| 9,263,333 | B2 * | 2/2016 | Sugo | H01L 21/6835 |
| 9,646,868 | B2 * | 5/2017 | Yasuda | B24B 37/30 |
| 9,941,145 | B2 * | 4/2018 | Tanabe | H01L 21/6835 |
| 2002/0014692 | A1 * | 2/2002 | Yamada | C08K 3/08 257/712 |
| 2005/0233547 | A1 | 10/2005 | Noda et al. | |
| 2007/0120271 | A1 * | 5/2007 | Kozakai | C09J 7/0246 257/779 |
| 2007/0224378 | A1 * | 9/2007 | Takeuchi | B32B 7/06 428/40.1 |
| 2008/0090380 | A1 | 4/2008 | Gardner et al. | |
| 2008/0254247 | A1 * | 10/2008 | Asaine | C09D 183/04 428/40.9 |
| 2009/0258216 | A1 * | 10/2009 | Yamakawa | C09J 183/14 428/323 |
| 2010/0038035 | A1 * | 2/2010 | Noda | B32B 43/006 156/379.6 |
| 2010/0247906 | A1 * | 9/2010 | Lee | C09J 7/30 428/344 |
| 2010/0255240 | A1 * | 10/2010 | Beppu | B32B 7/06 428/41.8 |
| 2010/0310808 | A1 * | 12/2010 | Beppu | B32B 27/08 428/41.3 |
| 2011/0076465 | A1 * | 3/2011 | Takeda | C08L 83/06 428/195.1 |
| 2011/0136321 | A1 | 6/2011 | Kuroda et al. | |
| 2011/0250401 | A1 * | 10/2011 | Dudley | H01L 21/02096 428/161 |
| 2012/0175045 | A1 | 7/2012 | Furuya et al. | |
| 2012/0276717 | A1 | 11/2012 | Furuya et al. | |
| 2013/0029145 | A1 * | 1/2013 | Kato | C09J 183/04 428/354 |
| 2013/0071673 | A1 | 3/2013 | Okawa et al. | |
| 2013/0084459 | A1 * | 4/2013 | Larson | C09J 4/00 428/422 |
| 2013/0108866 | A1 * | 5/2013 | Kato | C08G 77/52 428/354 |
| 2013/0220687 | A1 | 8/2013 | Tagami et al. | |
| 2013/0280886 | A1 * | 10/2013 | Kato | B32B 7/06 438/459 |
| 2013/0302983 | A1 * | 11/2013 | Tanabe | H01L 21/6835 438/691 |
| 2013/0334366 | A1 * | 12/2013 | Wilenski | B29C 70/546 244/117 R |
| 2014/0057450 | A1 * | 2/2014 | Bourbina | H01L 21/6835 438/759 |
| 2014/0084482 | A1 * | 3/2014 | Hu | H01L 24/06 257/774 |
| 2014/0120356 | A1 * | 5/2014 | Shearer | C09J 11/02 428/457 |
| 2014/0131898 | A1 * | 5/2014 | Shearer | H01L 24/29 257/783 |
| 2014/0154868 | A1 * | 6/2014 | Sugo | H01L 21/6835 438/458 |
| 2014/0213039 | A1 * | 7/2014 | Lee | H01L 21/6835 438/459 |
| 2015/0124338 | A1 * | 5/2015 | Mayumi | G02B 19/0009 359/742 |

(56) References Cited

U.S. PATENT DOCUMENTS

| | | | |
|---|---|---|---|
| 2015/0140324 A1* | 5/2015 | Kishimoto | C09J 175/04 428/336 |
| 2015/0148273 A1* | 5/2015 | Matsumoto | C08L 83/04 508/139 |
| 2015/0221517 A1* | 8/2015 | Kim | H01L 21/6835 438/460 |
| 2015/0240141 A1* | 8/2015 | Tsuchida | C09J 183/04 428/355 R |
| 2016/0049324 A1* | 2/2016 | Yamaguchi | C08L 33/08 257/618 |
| 2016/0089843 A1* | 3/2016 | Rugtvedt | B29C 35/02 264/291 |
| 2016/0167345 A1* | 6/2016 | Saiki | B32B 7/06 257/632 |
| 2016/0189996 A1* | 6/2016 | Tanabe | C09J 183/04 428/354 |
| 2016/0189998 A1* | 6/2016 | Yasuda | B24B 37/30 438/692 |
| 2016/0194459 A1* | 7/2016 | Kozar | C08J 5/005 523/201 |
| 2016/0233395 A1* | 8/2016 | Miyamoto | C08K 5/3472 |
| 2016/0289519 A1* | 10/2016 | Yasuda | C08G 77/04 |
| 2016/0326414 A1* | 11/2016 | Tagami | C08L 83/04 |
| 2016/0375652 A1* | 12/2016 | Yamaguchi | B32B 7/06 156/247 |
| 2017/0004989 A1* | 1/2017 | Tanabe | C09J 109/06 |
| 2017/0053821 A1* | 2/2017 | Sugo | C09J 183/00 |
| 2017/0069521 A1* | 3/2017 | Sugo | B32B 27/08 |
| 2017/0101555 A1* | 4/2017 | Yasuda | C09J 5/00 |
| 2017/0110360 A1* | 4/2017 | Tagami | H01L 21/304 |
| 2017/0130012 A1* | 5/2017 | Wilenski | C08J 5/005 |
| 2018/0102333 A1* | 4/2018 | Yasuda | H01L 24/04 |

FOREIGN PATENT DOCUMENTS

| | | | |
|---|---|---|---|
| JP | 2004-064040 A | 2/2004 | |
| JP | 2006-328104 A | 12/2006 | |
| JP | 2008-532313 A | 8/2008 | |
| JP | 2012-033737 A | 2/2012 | |
| JP | 2013-110391 A | 6/2013 | |
| JP | 2013-232459 A | 11/2013 | |
| JP | 2013-243350 A | 12/2013 | |
| TW | 201241897 A | 10/2012 | |
| TW | 201400578 A | 1/2014 | |
| TW | 201406911 A | 2/2014 | |
| WO | WO 2008098404 A2 * | 8/2008 | C30B 29/30 |

OTHER PUBLICATIONS

Jul. 26, 2017 extended European Search Report issued in Application No. 15764462.6.

Jun. 5, 2018 Office Action issued in Taiwanese Application No. 104108323.

Apr. 23, 2018 Office Action issued in Chinese Application No. 201580014475.9.

* cited by examiner

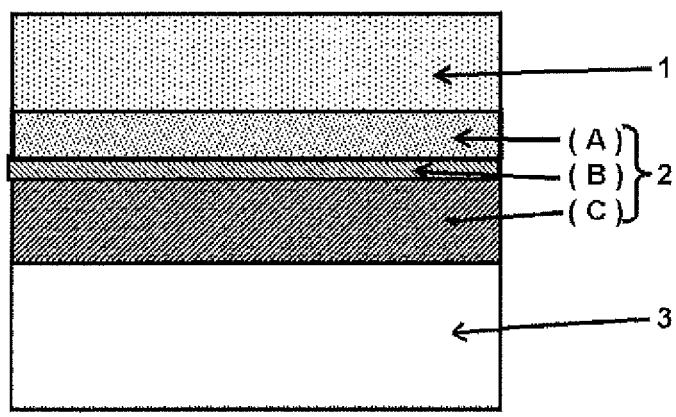

WAFER PROCESSING LAMINATE, TEMPORARY ADHESIVE MATERIAL FOR WAFER PROCESSING, AND METHOD FOR MANUFACTURING THIN WAFER

TECHNICAL FIELD

The present invention relates to a wafer processing laminate, a temporary adhesive material for a wafer processing, and a method for manufacturing a thin wafer that enable a thin wafer to be obtained effectively.

BACKGROUND ART

Three-dimensional semiconductor mounting has become essential for higher density and larger capacity. The three-dimensional mounting technique is a semiconductor production technique for thinning a semiconductor chip and connecting the chip to another chip by a through silicon via (TSV) to form a multilayer. To realize this technique, steps of grinding a non-circuit-forming surface (also referred to as "back surface") of a substrate on which a semiconductor circuit has been formed to thin the substrate, and then forming an electrode including a TSV on the back surface, are required. In the step of grinding the back surface of a silicon substrate, a protective tape for the back surface is conventionally attached to a surface opposite to the surface to be ground to prevent the wafer from breaking during grinding. However, this tape uses an organic resin film as its supporting base, which has flexibility, but inadequate strength and heat resistance. Thus, this tape is not suited to the steps of forming a TSV and forming a wiring layer on the back surface.

In this context, there has been proposed a system in which a semiconductor substrate is bonded to a support made of silicon, glass or the like, through an adhesive layer to sufficiently withstand the steps of grinding the back surface and forming a TSV and an electrode on the back surface. In this system, the adhesive layer used for bonding the substrate to the support is important. The adhesive layer requires a sufficient durability to bond the substrate and the support without gaps and to withstand subsequent steps, and also requires an ability to easily detach a thin wafer from the support finally. The adhesive layer, which is finally removed, is hence referred to as "temporary adhesive layer" (or temporary adhesive material layer) herein.

With respect to the conventionally known temporary adhesive layer and a method for removing this layer, the following techniques have been proposed: an adhesive material containing a light-absorbing substance is irradiated with high intensity light to decompose the adhesive material layer, whereby the adhesive material layer is removed from the support (Patent Literature 1); a heat fusible hydrocarbon compound is used for the adhesive material, and bonding and removal are carried out in a heat-molten state (Patent Literature 2). The former technique has problems of requiring expensive tools such as laser, and a long treatment time per substrate. The latter technique is simple because of control only by heat, but thermal stability is insufficient at a high temperature exceeding 200° C., and thus the applicable range is limited. Furthermore, these temporary adhesive layers are not adequate to form a film with uniform thickness on a heavily stepped substrate and to provide a complete adhesion to the support.

Besides, it has been proposed to use a silicone adhesive for the temporary adhesive material layer (Patent Literature 3). In this technique, a substrate is bonded to a support with an addition-curable silicone adhesive, and on the removal, the assembly is immersed in a chemical solution capable of dissolving or decomposing the silicone resin to separate the substrate from the support. Thus, this method takes a very long time for separation and is difficultly applied to the actual manufacturing process.

CITATION LIST

Patent Literature

PATENT LITERATURE 1: Japanese Unexamined Patent publication (Kokai) No. 2004-64040
PATENT LITERATURE 2: Japanese Unexamined Patent publication (Kokai) No. 2006-328104
PATENT LITERATURE 3: U.S. Pat. No. 7,541,264

SUMMARY OF INVENTION

Technical Problem

The present invention was accomplished in view of the above-described problems. It is an object of the present invention to provide a wafer processing laminate and a temporary adhesive material for a wafer processing that facilitate temporary adhesion, allow formation of the layer with uniform film thickness on a heavily stepped substrate, are highly compatible with the steps of forming a TSV and forming a wiring on the back surface of the wafer, have excellent resistance to a thermal process for wafer such as chemical vapor deposition (CVD), allow easy separation, and can increase productivity of thin wafers, and further provide a method for manufacturing a thin wafer using the same.

Solution to Problem

To achieve this object, the present invention provides a temporary adhesive material for a wafer processing, the temporary adhesive material being used for temporarily bonding a support and a wafer having a front surface on which a circuit is formed and a back surface to be processed, comprising
a complex temporary adhesive material layer having a three-layered structure that includes a first temporary adhesive layer composed of a non-silicone thermoplastic resin layer (A) capable of releasably adhering to the front surface of the wafer, a second temporary adhesive layer composed of a thermosetting siloxane polymer layer (B) laminated on the first temporary adhesive layer, and a third temporary adhesive layer composed of a thermosetting siloxane-modified polymer layer (C) laminated on the second temporary adhesive, layer and capable of releasably adhering to the support.

Furthermore, the present invention provides a wafer processing laminate comprising a support, a temporary adhesive material layer formed on the support, and a wafer stacked on the temporary adhesive material layer, the wafer having a front surface on which a circuit is formed and a back surface to be processed, wherein
the temporary adhesive material layer comprises a complex temporary adhesive material layer having a three-layered structure that includes a first temporary adhesive layer composed of a non-silicone thermoplastic resin layer (A) releasably adhering to the front surface of the wafer, a second temporary adhesive layer composed of a thermosetting siloxane polymer layer (B) laminated on the first temporary adhesive layer, and a third temporary adhesive layer composed of a thermosetting siloxane-modified polymer layer (C) laminated on the second temporary adhesive layer and releasably adhering to the support.

Use of such a wafer processing laminate or a temporary adhesive material for a wafer processing facilitates temporary adhesion between the wafer and the support, allows formation of the layer with uniform film thickness on a heavily stepped substrate, enables high compatibility with the steps of forming a TSV and forming a wiring on the back surface of the wafer and excellent resistance to a thermal process such as CVD, allows easy separation, and can increase productivity of the thin wafers.

The thermosetting siloxane polymer layer (B) is preferably a cured layer of a composition containing:
(B-1) an organopolysiloxane having two or more alkenyl groups per molecule;
(B-2) an organohydrogenpolysiloxane having two or more silicon-bonded hydrogen atoms (Si—H groups) per molecule, in such an amount that a mole ratio of the Si—H group in the component (B-2) to the alkenyl group in the component (B-1) ranges from 0.3 to 10; and
(B-3) a platinum-based catalyst.

Such a thermosetting siloxane polymer layer (B) is more excellent in CVD resistance, and thus preferable.

The thermosetting siloxane polymer layer (B) preferably further contains (B-4) a reaction retarder in an amount of 0.1 to 10 parts by mass based on 100 parts by mass of a total of the component (B-1) and the component (B-2).

Such a thermosetting siloxane polymer layer (B) can prevent the solution to be treated (i.e. the composition) from thickening and gelling before heat curing.

The thermosetting siloxane polymer layer (B) preferably exhibits a 180° peeling force of 2 gf to 50 gf after heat curing, the 180° peeling force being measured with a test piece having a width of 25 mm.

The thermosetting siloxane polymer layer (B) exhibiting such a peeling force prevents the wafer from slipping at the time of grinding the wafer, enabling easy separation. Thus, it is preferable.

The thermosetting siloxane-modified polymer layer (C) is preferably a cured layer of a composition containing 100 parts by mass of a siloxane bond-containing polymer having a repeating unit shown by the following general formula (1) and a weight average molecular weight of 3,000 to 500,000, preferably 10,000 to 100,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

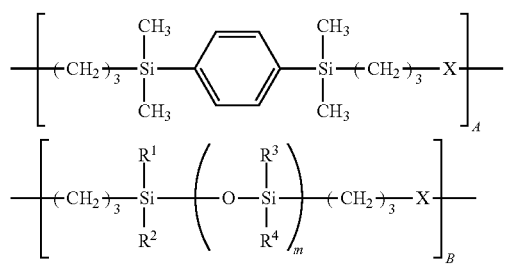

(1)

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and X is a divalent organic group shown by the following general formula (2),

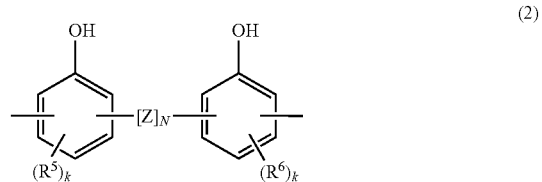

(2)

wherein Z represents a divalent organic group selected from any of

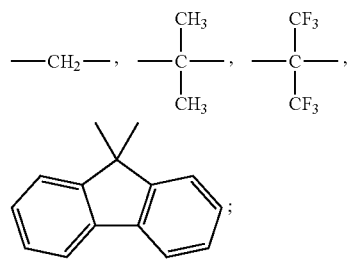

N represents 0 or 1; $R^5$ and $R^6$ each represent an alkyl or alkoxy group having 1 to 4 carbon atoms, and may be the same or different from each other; and "k" represents any of 0, 1, and 2.

Such a thermosetting siloxane-modified polymer layer (C) is more excellent in heat resistance, and thus preferable.

Moreover, the thermosetting siloxane-modified polymer layer (C) is preferably a cured layer of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

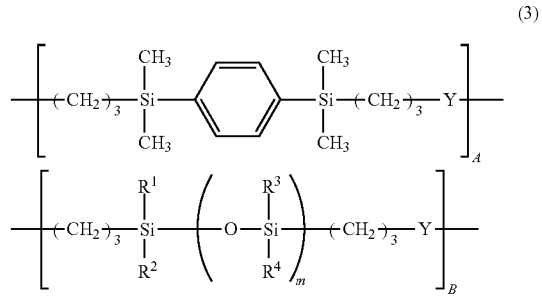

(3)

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and Y is a divalent organic group shown by the following general formula (4),

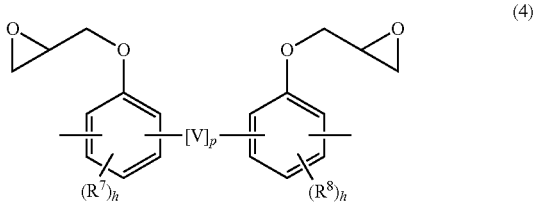

(4)

wherein V represents a divalent organic group selected from any of

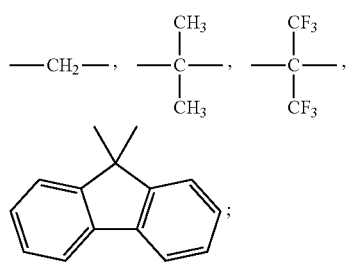

"p" represents 0 or 1; $R^7$ and $R^8$ each represent an alkyl or alkoxy group having 1 to 4 carbon atoms, and may be the same or different from each other; and "h" represents any of 0, 1, and 2.

Such a thermosetting siloxane-modified polymer layer (C) is more excellent in heat resistance, and thus preferable.

Furthermore, the present invention provides a method for manufacturing a thin wafer, comprising the steps of: (a) bonding a support and a circuit-forming front surface of a wafer that has the circuit-forming front surface and a non-circuit-forming back surface through a complex temporary adhesive material layer used in the inventive temporary adhesive material for a wafer processing, the complex temporary adhesive material layer including the non-silicone thermoplastic resin layer (A), the thermosetting siloxane polymer layer (B), and the thermosetting siloxane-modified polymer layer (C), wherein the bonding is performed by forming the thermosetting siloxane-modified polymer layer (C) on the support, forming the thermosetting siloxane polymer layer (B) on the polymer layer (C), and then bonding the support, on which the polymer layers (C) and (B) have been formed, to the wafer on which a circuit and the polymer layer (A) have been formed, under vacuum;
(b) heat curing the polymer layers (B) and (C);
(c) grinding or polishing the non-circuit-forming back surface of the wafer bonded to the support;
(d) processing the non-circuit-forming back surface of the wafer; and
(e) separating the processed wafer from the support.

Such a method for manufacturing a thin wafer uses the temporary adhesive material layer including three layers of the present invention to bond the wafer and the support. Use of this temporary adhesive material layer allows easy production of a thin wafer having a through electrode structure or a bump connection structure.

Advantageous Effects of Invention

The temporary adhesive material layer in the present invention has the three-layered structure, and particularly uses the thermosetting siloxane-modified resin (polymer layer (C)) as a supporting layer for bonding a substrate. This resin does not thermally decompose, does not flow at a high temperature especially of 200° C. or higher, and has excellent heat resistance. The temporary adhesive material layer is thus applicable to a wide range of semiconductor film-forming process, and can form an adhesive material layer with high film-thickness uniformity even on a stepped wafer. This film-thickness uniformity enables a uniform thin wafer 50 μm or less thick to be easily manufactured. Moreover, after the thin wafer is manufactured, the wafer can be easily separated from the support, for example, at room temperature. Thus, the thin wafer, which is easy to break, can be readily manufactured. Furthermore, the present invention, which includes the thermosetting siloxane polymer layer (B) as the polymer layer (B), is excellent in CVD resistance.

BRIEF DESCRIPTION OF DRAWING

FIG. 1 is a cross-sectional view of an exemplary wafer processing laminate of the present invention.

DESCRIPTION OF EMBODIMENTS

Hereinafter, the present invention will be described in detail.

As described above, it has been desired to develop a temporary adhesive material for a wafer processing that facilitates temporary adhesion, allows formation of the layer with uniform film thickness on a heavily stepped substrate, is highly compatible with the steps of forming a TSV and forming a wiring on the back surface of the wafer, has excellent resistance to a wafer thermal process such as CVD, allows easy separation, and can increase productivity of thin wafers.

The present inventors earnestly studied to accomplish the above object and consequently found a method that can easily manufacture a thin wafer having a through electrode structure or a bump interconnect structure by using a complex temporary adhesive material layer that has a three-layer system including:
(A) a thermoplastic temporary adhesive layer composed of a non-silicone thermoplastic resin layer;
(B) a thermosetting temporary adhesive layer composed of a thermosetting siloxane polymer layer; and
(C) a thermosetting temporary adhesive layer composed of a thermosetting siloxane-modified polymer layer, in which the layers are formed in the order of (A), (B), and (C) from the wafer side to bond the wafer and the support.

FIG. 1 is a cross-sectional view of an exemplary wafer processing laminate of the present invention. As shown in FIG. 1, the wafer processing laminate of the present invention has a wafer (device wafer) 1 having a front surface on which a circuit is formed and a back surface to be processed, a support 3 for supporting the wafer 1 during processing the wafer 1, and a temporary adhesive material layer 2 placed between the wafer 1 and the support 3. The temporary adhesive material layer 2 has a three-layered structure including a non-silicone thermoplastic resin layer (A) (first temporary adhesive layer), a thermosetting siloxane polymer layer (B) (second temporary adhesive layer), and a thermosetting siloxane-modified polymer layer (C) (third temporary adhesive layer). The first temporary adhesive layer releasably adheres to the front surface of the wafer 1, and the third temporary adhesive layer releasably adheres to the support 3.

The temporary adhesive material for a wafer processing of the present invention is composed of a laminated material of the polymer layers (A), (B), and (C).

The present invention will be described in more detail below, but the present invention is not limited thereto.
[Temporary Adhesive Material Layer]
—First Temporary Adhesive Layer (A)/Non-Silicone Thermoplastic Resin Layer (Thermoplastic Polymer Layer not Containing Organopolysiloxane)—

The first temporary adhesive layer (A) is composed of a thermoplastic resin containing no organopolysiloxane. In view of applicability to stepped silicon wafers, etc., a thermoplastic resin having a good spin coating property is suitably used as a material for forming the first temporary adhesive layer (A). In particular, the thermoplastic resin preferably has a glass transition temperature of about −80 to 120° C. Examples thereof include an olefin type thermoplastic elastomer, a polybutadiene type thermoplastic elastomer, a styrene type thermoplastic elastomer, a styrene-butadiene type thermoplastic elastomer, and a styrene-polyolefin type thermoplastic elastomer. A hydrogenated polystyrene type elastomer excellent in heat resistance is particularly suitable. More specifically, there may be mentioned Tuftec (Asahi Kasei Chemicals Corporation), ESPOLEX SB series (Sumitomo Chemical Co., Ltd.), RABALON (Mitsubishi Chemical Corporation), SEPTON (Kuraray Co., Ltd.), and DYNARON (JSR). In addition, there may be mentioned a cycloolefin polymer represented by ZEONEX (ZEON Corporation) and a cyclic olefin copolymer represented by TOPAS (Nippon Polyplastics Co., Ltd.).

As descried above, the non-silicone thermoplastic resin layer (A) is preferably a non-silicone thermoplastic elastomer.

Such a layer enables, after a thin wafer is manufactured, the wafer to be easily separated from the support. Thus, a fragile thin wafer can be easily handled.

The non-silicone thermoplastic resin layer is formed by dissolving the resin in a solvent and applying the solution on a semiconductor substrate such as a silicon wafer by means of spin coating or spray coating, etc. Examples of the solvent include hydrocarbon solvents, preferably nonane, p-menthane, pinene, and isooctane. Nonane, p-menthane, and isooctane are particularly preferable because of their coating properties. The thickness of the film to be formed is not limited, but the resin film is desirably formed, depending on unevenness on the substrate, preferably with a film thickness of 0.5 micron to 50 microns, more preferably 0.5 to 10 μm. To the thermoplastic resin may be added an antioxidant for the purpose of improving heat resistance, or a surfactant for the purpose of improving coating property. Illustrative examples of the antioxidant that can be suitably used include di-tert-butylphenol. Examples of the surfactant that can be suitably used include a fluorine-containing silicone type surfactant X-70-1102 (available from Shin-Etsu Chemical Co., Ltd.).
—Second Temporary Adhesive Layer (B)/Thermosetting Siloxane Polymer Layer (Thermosetting Silicone Polymer Layer)—

The thermosetting siloxane polymer layer (B), which is a constitutional element of the wafer processing laminate and the temporary adhesive material for a wafer processing of the present invention, is not particularly limited so long as it is composed of a thermosetting siloxane polymer. For example, the polymer layer (B) is preferably a cured layer of a composition containing the following components (B-1) to (B-3) and optional component (B-4).

(B-1) an organopolysiloxane having two or more alkenyl groups per molecule;
(B-2) an organohydrogenpolysiloxane having two or more silicon-bonded hydrogen atoms (Si—H groups) per molecule, in such an amount that a mole ratio of the Si—H group in the component (B-2) to the alkenyl group in the component (B-1) ranges from 0.3 to 10;
(B-3) a platinum-based catalyst.

This thermosetting siloxane polymer layer (B) preferably further contains (B-4) a reaction retarder in an amount of 0.1 to 10 parts by mass based on 100 parts by mass of a total of the component (B-1) and the component (B-2).

Each component will be described below.
[Component (B-1)]

The component (B-1) is an organopolysiloxane having two or more alkenyl groups per molecule. The component (B-1) is preferably a linear or branched diorganopolysiloxane containing two or more alkenyl groups per molecule, particularly preferably a diorganopolysiloxane containing 0.3 to 10 mol %, particularly 0.6 to 9 mol % (mole of alkenyl group/mole of Si) of alkenyl groups per molecule.

Illustrative examples of such diorganopolysiloxane include compounds shown by the following general formula (5) and/or (6),

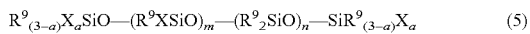

$$R^9{}_{(3-a)}X_aSiO—(R^9XSiO)_m—(R^9{}_2SiO)_n—SiR^9{}_{(3-a)}X_a \quad (5)$$

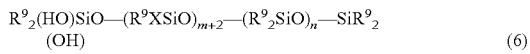

$$R^9{}_2(HO)SiO—(R^9XSiO)_{m+2}—(R^9{}_2SiO)_n—SiR^9{}_2(OH) \quad (6)$$

wherein $R^9$ independently represents a monovalent hydrocarbon group having no aliphatic unsaturated bond; X independently represents a monovalent organic group containing an alkenyl group; and "a" is an integer of 0 to 3. In the formula (5), 2a+m is such a number that the content of alkenyl group is 0.3 to 10 mol % per molecule. In the formula (6), m+2 is such a number that the content of alkenyl group is 0.3 to 10 mol % per molecule; "m" is 0 or a positive number of 10 or less, and "n" is a positive number of 1 to 1000.

In the above formulae, $R^9$ is preferably a monovalent hydrocarbon group having 1 to 10 carbon atoms. Examples thereof include alkyl groups such as a methyl group, an ethyl group, a propyl group, and a butyl group; cycloalkyl groups such as a cyclohexyl group; and aryl groups such as a phenyl group and a tolyl group. In particular, a phenyl group and alkyl groups such as a methyl group are preferable.

X, a monovalent organic group having an alkenyl group, is preferably an organic group having 2 to 10 carbon atoms. Examples thereof include alkenyl groups such as a vinyl group, an allyl group, a hexenyl group, and an octenyl group; (meth)acryloylalkyl groups such as an acryloylpropyl group, acryloylmethyl group, and methacryloylpropyl group; (meth)acryloxyalkyl groups such as an acryloxypropyl group, an acryloxymethyl group, a methacryloxypropyl group, and a methacryloxymethyl group; and alkenyl group-containing monovalent hydrocarbon groups such as a cyclohexenylethyl group and a vinyloxypropyl group. In particular, a vinyl group is industrially preferable.

In the general formula (5), "a" is an integer of 0 to 3, preferably 1 to 3. This preferable range allows terminals of the molecular chain to be blocked with alkenyl groups, and thus the reaction can be completed within a short time by the alkenyl groups with good reactivity at the terminals of the molecular chain. Furthermore, a=1 is industrially preferable in view of the cost. This alkenyl group-containing diorganopolysiloxane is preferably in an oil state or a crude rubber state. The alkenyl group-containing diorganopolysiloxane may be linear or branched.

[Component (B-2)]

The component (B-2) is a crosslinker, an organohydrogenpolysiloxane having two or more silicon-bonded hydrogen atoms (Si—H groups) per molecule. The component (B-2) has at least two, preferably 3 or more silicon-bonded hydrogen atoms (SiH groups) per molecule, and may have a linear, branched, or cyclic structure.

The viscosity at 25° C. of the organohydrogenpolysiloxane, component (B-2), is preferably 1 to 5,000 mPa·s, more preferably 5 to 500 mPa·s. The organohydrogenpolysiloxane may be a mixture of two or more kinds.

The component (B-2) is preferably blended such that a mole ratio of the Si—H group in the component (B-2) to the alkenyl group in the component (B-1) (SiH group/alkenyl group) ranges from 0.3 to 10, particularly 1.0 to 8.0. When the mole ratio between the SiH group and the alkenyl group is 0.3 or more, crosslinking density does not decrease, and the problem of inability to cure the adhesive layer is not caused. When the mole ratio is 10 or less, the crosslinking density does not excessively increase, and sufficient viscosity and tackiness can be achieved. In addition, the mole ratio of 10 or less prolongs the available time of the solution to be treated.

[Component (B-3)]

The component (B-3) is a platinum-based catalyst (i.e. platinum group metal catalyst). Examples thereof include chloroplatinic acid, an alcohol solution of chloroplatinic acid, a reaction product of chloroplatinic acid with alcohol, a reaction product of chloroplatinic acid with an olefin compound, and a reaction product of chloroplatinic acid with a vinyl group-containing siloxane.

The adding amount of the component (B-3) is an effective amount, typically 1 to 5,000 ppm, preferably 5 to 2,000 ppm, in terms of (the mass of) platinum, with respect to the total of (B-1) and (B-2) (if a later-described component (B-4) is contained, the total of (B-1), (B-2), and (B-4)). When the amount is 1 ppm or more, curability of the composition does not decrease, and crosslinking density and holding force also do not decrease. When the amount is 0.5% or less, the available time of the solution to be treated can be prolonged.

[Component (B-4)]

The component (B-4) is a reaction retarder, and is optionally added when the composition is prepared or applied to the base to prevent the solution to be treated from thickening and gelling before heat curing.

Illustrative examples thereof include 3-methyl-1-butyn-3-ol, 3-methyl-1-pentyn-3-ol, 3,5-dimethyl-1-hexyn-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynoxy)dimethylsilane, 1,3,5,7-tetramethyl-1,3,5,7-tetravinylcyclotetrasiloxane, and 1,1,3,3-tetramethyl-1,3-divinyldisiloxane. Among them, 1-ethynylcyclohexanol and 3-methyl-1-butyn-3-ol are preferable.

If the component (B-4) is contained in the composition, the formulation amount thereof is preferably 0.1 to 10 parts by mass, more preferably 0.1 to 8.0 parts by mass, much more preferably 0.1 to 2.0 parts by mass, based on 100 parts by mass of the total of the components (B-1) and (B-2). When the amount is 10 parts by mass or less, curability of the silicone adhesive composition does not decrease. When the amount is 0.1 part by mass or more, the effect of reaction retarder can be sufficiently exhibited.

To the thermosetting siloxane polymer layer (B) may be added an organopolysiloxane having $R^{10}{}_3SiO_{0.5}$ units and $SiO_2$ units with $R^{10}{}_3SiO_{0.5}$ unit/$SiO_2$ unit mole ratio of 0.3 to 1.8, where $R^{10}$ independently represents a substituted or unsubstituted monovalent hydrocarbon group having 1 to 10 carbon atoms. The adding amount thereof is preferably 0 to 30 mass % of the component (B-1) in the thermosetting siloxane polymer layer (B).

The thermosetting siloxane polymer layer (B) may be formed on an uncured thermosetting siloxane-modified polymer layer (C) on the support, by applying its solution by a method such as spin coating or roll coater. If the thermosetting siloxane polymer layer (B) is formed on the thermosetting siloxane-modified polymer layer (C) laminated on the support by spin coating, it is preferred to apply a solution of the polymer layer (B). In this case, a hydrocarbon solvent, such as pentane, hexane, cyclohexane, isooctane, nonane, decane, p-menthane, pinene, isododecane, or limonene, is suitably used. In addition, a known antioxidant may be added to the solution of the polymer layer (B) to improve heat resistance.

The thermosetting siloxane polymer layer (B) is preferably formed with a film thickness of 0.1 to 30 μm, particularly 1.0 to 15 μm. When the film thickness is 0.1 μm or more, the layer can fully coat the thermosetting siloxane-modified polymer layer (C) without an uncoated region. When the film thickness is 30 μm or less, it can withstand the grinding step for thinning the wafer. In addition, the thermosetting siloxane polymer layer (B) may further contain a filler such as silica in an amount of 50 parts by mass or less based on 100 parts by mass of the polymer layer (B) to further improve heat resistance.

The thermosetting siloxane polymer layer (B) typically exhibits a 180° peeling force of 2 gf to 50 gf, preferably 3 gf to 30 gf, more preferably 5 gf to 20 gf after heat curing when the 180° peeling force is measured with a test piece (for example, a polyimide test piece) having a width of 25 mm. When the peeling force is 2 gf or more, the wafer is prevented from slipping at the time of grinding the wafer. When the peeling force is 50 gf or less, the wafer can be easily separated.

—Third Temporary Adhesive Layer (C)/Thermosetting Siloxane-Modified Polymer Layer—

The thermosetting siloxane-modified polymer layer (C), which is a constitutional element of the wafer processing laminate and the temporary adhesive material for a wafer processing of the present invention, is not particularly limited so long as it is a thermosetting siloxane-modified polymer layer. The polymer layer (C) is preferably a cured layer of the thermosetting composition mainly consisting of the thermosetting siloxane-modified polymer shown by the following general formula (1) or (3).

Polymer of Formula (1) (Phenolic Siloxane Polymer):

A polymer of the general formula (1) is a siloxane bond-containing polymer. This polymer has a repeating unit shown by the general formula (1) and a weight average molecular weight of 3,000 to 500,000, preferably 10,000 to 100,000,

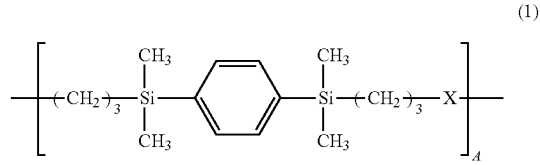

(1)

-continued

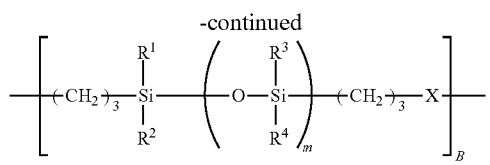

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group shown by the following general formula (2). In this formula, A+B=1, and it is preferred that A is 0 to 0.9 and B is 0.1 to 1. When A is added, it is preferred that A is 0.1 to 0.7 and B is 0.3 to 0.9.

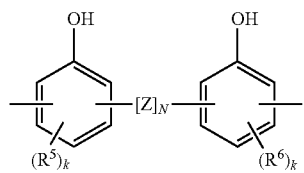

(2)

wherein Z represents a divalent organic group selected from any of

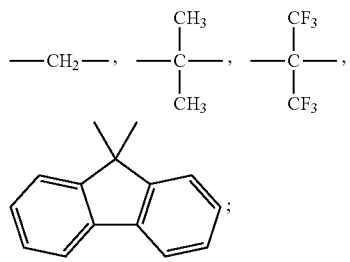

N represents 0 or 1; $R^5$ and $R^6$ each represent an alkyl or alkoxy group having 1 to 4 carbon atoms, and may be the same or different from each other; and "k" represents any of 0, 1, and 2.

In this case, illustrative examples of $R^1$ to $R^4$ include a methyl group, an ethyl group, and a phenyl group. "m" represents an integer of preferably 3 to 60, more preferably 8 to 40. B/A ranges from 0 to 20, particularly from 0.5 to 5.

Polymer of Formula (3) (Epoxy-Modified Siloxane Polymer):

A polymer of the general formula (3) is a siloxane bond-containing polymer. This polymer has a repeating unit shown by the general formula (3) and a weight average molecular weight of 3,000 to 500,000,

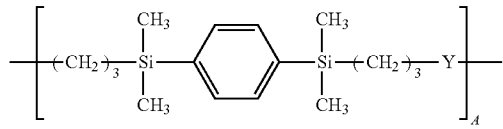

(3)

-continued

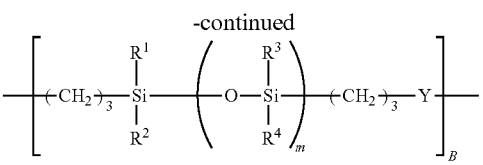

wherein $R^1$ to $R^4$ may be the same or different, and represent a monovalent hydrocarbon group having 1 to 8 carbon atoms; "m" is an integer of 1 to 100; B is a positive number; A is 0 or a positive number; and Y is a divalent organic group shown by the following general formula (4). In this formula, A+B=1, and it is preferred that A is 0 to 0.9 and B is 0.1 to 1. When A is added, it is preferred that A is 0.1 to 0.7 and B is 0.3 to 0.9.

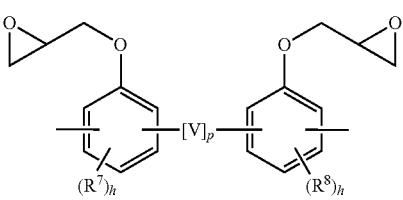

(4)

wherein V represents a divalent organic group selected from any of

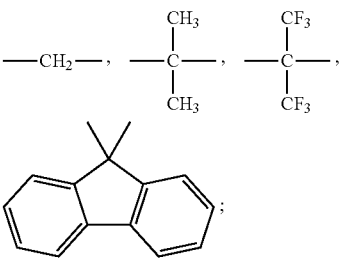

"p" represents 0 or 1; $R^7$ and $R^8$ each represent an alkyl or alkoxy group having 1 to 4 carbon atoms, and may be the same or different from each other; and "h" represents any of 0, 1, and 2.

In this case, illustrative examples of $R^1$ to $R^4$ and "m" are the same as in the general formula (1).

The thermosetting composition mainly consisting of the thermosetting siloxane-modified polymer of the general formula (1) or (3) contains one or more crosslinkers for heat curing. In the case of the phenolic siloxane polymer of the general formula (1), the crosslinker is selected from an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule.

Here, the amino condensate, the melamine resin, the urea resin each modified with formalin or formalin-alcohol may be exemplified by the following. For example, the melamine resin (condensate) modified with formalin or formalin-alcohol can be obtained by addition condensation polymerization of a modified melamine monomer (e.g. trimethoxymethyl monomethylol melamine), or a polymer thereof (e.g. oligomer such as dimer and trimer) with formaldehyde until a desired molecular weight is achieved, according to a known method. These compounds may be used alone or in combination of two or more kinds.

The urea resin (condensate) modified with formalin or formalin-alcohol can be prepared by modifying a urea condensate having a desired molecular weight with formalin into a methylol form, and optionally, further modifying the resultant compound with an alcohol into an alkoxy form, according to a known method. Illustrative examples of the urea resin modified with formalin or formalin-alcohol include methoxymethylated urea condensate, ethoxymethylated urea condensate, and propoxymethylated urea condensate. These compounds may be used alone or in combination of two or more kinds.

Illustrative examples of the phenol compound having on average two or more methylol or alkoxymethylol groups per molecule include (2-hydroxy-5-methyl)-1,3-benzenedimethanol and 2,2',6,6'-tetramethoxymethyl-bisphenol A. These phenol compounds may be used alone or in combination of two or more kinds.

On the other hand, in the case of the epoxy-modified siloxane polymer of the general formula (3), the composition contains one or more crosslinkers selected from an epoxy compound having on average two or more epoxy groups per molecule and a phenol compound having on average two or more phenol groups per molecule.

The epoxy compound having a polyfunctional epoxy group used in the polymers of the general formulae (1) and (3) is not particularly limited. In particular, a bi-functional, a tri-functional, or a tetra-functional or more of the polyfunctional epoxy resins, for example, EOCN-1020, EOCN-102S, XD-1000, NC-2000-L, EPPN-201, GAN, and NC6000, all available from Nippon Kayaku Co., Ltd., or a crosslinker shown by the following formula may be contained.

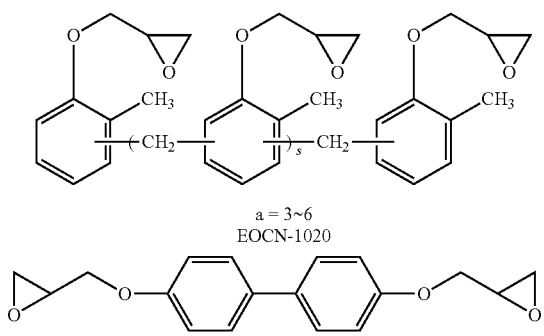

a = 3~6
EOCN-1020

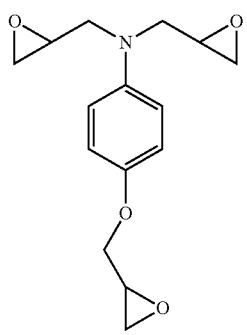

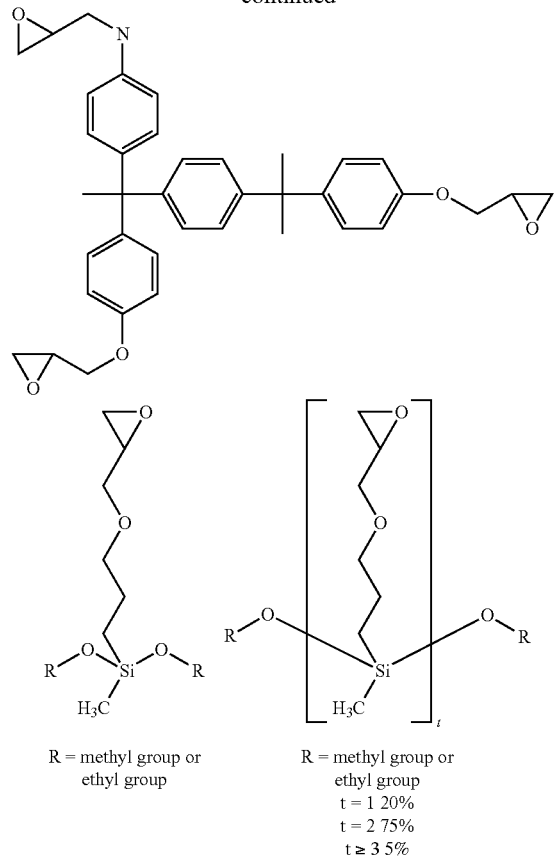

R = methyl group or ethyl group

R = methyl group or ethyl group
t = 1 20%
t = 2 75%
t ≥ 3 5%

In the case that the thermosetting siloxane-modified polymer is the epoxy-modified siloxane polymer of the general formula (3), examples of its crosslinker include m- or p-cresol-novolac resins such as EP-6030G available from Asahi Organic Chemicals Industry Co., Ltd., tri-functional phenol compounds such as Tris-P-PA4 available from Honshu Chemical Industry Co., Ltd., and tetra-functional phenol compounds such as TEP-TPA available from Asahi Organic Chemicals Industry Co., Ltd.

The formulation amount of the crosslinker is 0.1 to 50 parts by mass, preferably 0.1 to 30 parts by mass, more preferably 1 to 20 parts by mass based on 100 parts by mass of the thermosetting siloxane-modified polymer. Two, three or more crosslinkers may be blended in combination.

A curing catalyst such as an acid anhydride may be added in an amount of 10 parts by mass or less based on 100 parts by mass of the thermosetting siloxane-modified polymer.

The composition (the thermosetting siloxane-modified polymer) may be dissolved in a solvent and applied to a support by a method such as specifically spin coating, roll coater, and die coater. In this case, illustrative examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, propylene glycol mono-tert-butyl ether acetate, and γ-butyrolactone. These solvents may be used alone or in combination of two or more kinds.

In addition, a known antioxidant and a filler such as silica may be added in an amount of 50 parts by mass or less based on 100 parts by mass of the thermosetting siloxane-modified polymer to improve heat resistance. Moreover, a surfactant may be added to improve coating uniformity.

Illustrative examples of the antioxidant that can be added into the polymer layer (C) include hindered phenol compounds such as tetrakis[methylene-(3,5-di-tert-butyl-4-hydroxyhydrocinnamate)]methane (product name: Adekastab AO-60).

The thermosetting siloxane-modified polymer layer (C) composed of the above-mentioned thermosetting siloxane-modified polymer is preferably formed with a film thickness after curing of 15 to 150 μm, more preferably 20 to 120 μm, depending on unevenness at the wafer side. When the film thickness is 15 μm or more, it can sufficiently withstand the grinding step for thinning the wafer. When the film thickness is 150 μm or less, the resin is prevented from deforming in a heat treatment process such as TSV formation process, and can be put to practical use. Thus, this range is preferable.

[Method for Manufacturing Thin Wafer]

The method for manufacturing a thin wafer of the present invention is characterized by using the complex temporary adhesive material layer including three layers of the non-silicone thermoplastic resin layer (A), the thermosetting siloxane polymer layer (B), and the thermosetting siloxane-modified polymer layer (C) as the layer for bonding the support to the wafer having a semiconductor circuit or the like. The thickness of a thin wafer obtained by the manufacturing method of the present invention is typically 5 to 300 μm, more typically 10 to 100 μm.

The method for manufacturing a thin wafer of the present invention has the steps (a) to (e), and optional steps (f) to (i), if necessary.

[Step (a)]

Step (a) is a step of bonding a support and a circuit-forming front surface of a wafer that has the circuit-forming front surface and a non-circuit-forming back surface through the complex temporary adhesive material layer, which includes the non-silicone thermoplastic resin layer (A), the thermosetting siloxane polymer layer (B), and the thermosetting siloxane-modified polymer layer (C), for use in the inventive temporary adhesive material for a wafer processing. In this step, the bonding is performed by forming the thermosetting siloxane-modified polymer layer (C) on the support, forming the thermosetting siloxane polymer layer (B) on the polymer layer (C), and then bonding the support, on which the polymer layers (C) and (B) have been formed, to the wafer on which a circuit and the polymer layer (A) have been formed, under vacuum.

The wafer that has a circuit-forming surface and a non-circuit-forming surface is a wafer one of the surfaces of which is a circuit-forming surface, and the other surface of which is a non-circuit-forming surface. The wafer to which the present invention can be applied is typically a semiconductor wafer. Examples of the semiconductor wafer include not only a silicon wafer, but also a germanium wafer, a gallium-arsenic wafer, a gallium-phosphorus wafer, and a gallium-arsenic-aluminum wafer. The thickness of the wafer is typically, but not particularly limited to, 600 to 800 μm, more typically 625 to 775 μm.

As the support, a substrate such as a silicon wafer, a glass plate, and a quartz wafer can be used without any limitation.

In the present invention, it is not necessary to irradiate the temporary adhesive material layer with an energy beam through the support, so that the support does not require light transmittance.

The temporary adhesive layers (A), (B), and (C) may be each formed as a film on the wafer or the support. Alternatively, these layers may be formed by applying the respective solutions to the wafer or the support by, for example, spin coating or roll coater. In this case, after spin coating, the layers are prebaked at 80 to 200° C., preferably 100 to 180° C., depending on the volatile conditions of the used solvent, and then used.

The wafer and the support on which the temporary adhesive layers (A), (B), and (C) have been formed are formed into a substrate that is bonded via the layers (A), (B), and (C). At this time, the substrate is uniformly compressed under reduced pressure at a temperature in the range of preferably 40 to 200° C., more preferably 60 to 180° C. to form a wafer processing laminate (laminated substrate) in which the wafer is bonded to the support.

Examples of a wafer-bonding apparatus include a commercially available wafer-bonding apparatus such as EVG520IS and 850 TB manufactured by EV Group, and XBC300 manufactured by SUSS MicroTec AG.

[Step (b)]

Step (b) is a step of heat curing the polymer layers (B) and (C). After the wafer processing laminate (laminated substrate) is formed, the wafer processing laminate is heated at 120 to 220° C., preferably 150 to 200° C., for 10 minutes to 4 hours, preferably 30 minutes to 2 hours, to cure the polymer layers (B) and (C).

[Step (c)]

Step (c) is a step of grinding or polishing the non-circuit-forming back surface of the wafer bonded to the support, i.e., a step of grinding the wafer processing laminate obtained by bonding in the step (a) from the wafer back surface side to reduce the thickness of the wafer. The technique for grinding the wafer back surface is not particularly limited, and known grinding techniques may be used. The grinding is preferably performed while water is fed to the wafer and a grinding wheel (e.g. diamond) for cooling. Examples of an apparatus for grinding the wafer back surface include DAG-810 (product name) manufactured by DISCO Co., Ltd. The wafer back surface side may be subjected to CMP polishing.

[Step (d)]

Step (d) is a step of processing the non-circuit-forming back surface of the wafer processing laminate that has been ground, i.e., the non-circuit-forming surface of the wafer processing laminate that has been thinned by grinding the back surface. This step includes various processes applied in the wafer level. Examples thereof include electrode formation, metal wiring formation, and protective film formation. More specifically, there may be mentioned well-known processes including metal sputtering for forming electrodes or the like, wet etching for etching a sputtered metal layer, patterning process in which a resist is applied and subjected to exposure and development to form a pattern used as a mask for metal wiring formation, resist removal, dry etching, plating with metal, silicon etching for forming a TSV, and formation of an oxide film on silicon surface.

[Step (e)]

Step (e) is a step of separating the wafer processed in the step (d) from the support, i.e., a step of, after the thinned wafer is subjected to various processes, separating the wafer from the support before dicing. This separating step is generally carried out under relatively low temperature conditions from room temperature to about 60° C. This step may be performed by a procedure in which one of the wafer and the support of the wafer processing laminate is horizontally fixed, and the other is lifted at a certain angle with respect to the horizontal direction; or a procedure in which a protective film is bonded to the ground surface of the wafer, and then the wafer and the protective film are separated from the wafer processing laminate by peeling.

Both the separating procedures can be applied to the present invention, although it is not limited to these procedures. These separating procedures are usually carried out at room temperature.

The step (e), separating the processed wafer from the support, preferably includes the steps of:
(f) bonding a dicing tape to the surface of the processed wafer;
(g) attaching the dicing tape surface by vacuum suction to a suction surface; and
(h) separating the support from the processed wafer by peeling-off in a temperature range of the suction surface of 10° C. to 100° C. These steps enable the support to be easily separated from the processed wafer, and facilitate a subsequent dicing step.

After the processed wafer is separated from the support in the step (e), the temporary adhesive material layer remaining on the circuit-forming surface of the separated wafer is preferably removed, as step (i). The temporary adhesive layer (A) may partially remain on the circuit-forming surface of the wafer that has been separated from the support by the step (e). In this case, the temporary adhesive layer (A) can be removed by, for example, cleaning the wafer.

In the step (i), any cleaning solution can be used so long as the solution can dissolve the non-silicone thermoplastic resin layer constituting the layer (A) in the temporary adhesive material layer. Illustrative examples thereof include pentane, hexane, cyclohexane, decane, isononane, p-menthane, pinene, isododecane, and limonene. These solvents may be used alone or in combination of two or more kinds thereof. If removal is difficult, a base or an acid may be added to the solvent. Examples of the usable base include amines such as ethanolamine, diethanolamine, triethanolamine, triethylamine, and ammonia; and ammonium salts such as tetramethylammonium hydroxide. Examples of the usable acid include organic acids such as acetic acid, oxalic acid, benzenesulfonic acid, and dodecylbenzenesulfonic acid. The amount thereof is 0.01 to 10 mass %, preferably 0.1 to 5 mass % in terms of concentration in the cleaning solution. To improve removal efficiency of the residual matters, an existing surfactant may be added thereto. The cleaning may be performed by paddling, spraying, or dipping in a cleaner tank with the solution. The temperature in this operation is preferably 10 to 80° C., more preferably 15 to 65° C. If necessary, after dissolving the layer (A) in the dissolving solution, the wafer may be finally rinsed with water or an alcohol and then dried to obtain a thin wafer.

EXAMPLES

In the following, the present invention will be specifically described with reference to Examples and Comparative Example, but the present invention is not limited thereto.

Resin Synthesis Example 1

In a flask equipped with a stirrer, a thermometer, a nitrogen purge system, and a reflux condenser were put 43.1 g of 9,9'-bis(3-allyl-4-hydroxyphenyl)fluorene (M-1), 29.5 g of organohydrogensiloxane shown by the average structural formula (M-3), 135 g of toluene, and 0.04 g of chloroplatinic acid, and the mixture was heated at 80° C. Then, 17.5 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was then distilled off, and 80 g of cyclohexanone was added thereto to obtain a resin solution containing cyclohexanone as a solvent with a concentration of the resin solid of 50 mass %. When the molecular weight of the resin in the solution was measured by GPC, the weight average molecular weight was 45,000 in terms of polystyrene. Then, 50 g of the resin solution was mixed with 7.5 g of an epoxy crosslinker, EOCN-1020 available from NIPPON KAYAKU Co., Ltd., as a crosslinker, 0.2 g of BSDM (bis(tert-butylsulfonyl)diazomethane) available from Wako Pure Chemical Industries Ltd., as a curing catalyst, and 0.1 g of tetrakis[methylene-(3,5-di-tert-butyl-4-hydroxyhydrocinnamate)]methane (product name: Adekastab AO-60) as an antioxidant. The solution was then filtered through a 1-µm membrane filter to obtain a resin solution (C-1).

Resin Synthesis Example 2

In a 5-L flask equipped with a stirrer, a thermometer, a nitrogen purge system, and a reflux condenser, 84.1 g of epoxy compound (M-2) was dissolved in 600 g of toluene. Then, 294.6 g of compound (M-3) and 25.5 g of compound (M-4) were added to the solution, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 600 g of methyl isobutyl ketone (MIBK) was added thereto. This reaction solution was filtered under pressure through a filter to remove the platinum catalyst. The solvent in the resin solution was distilled off under reduced pressure, and 270 g of propylene glycol monomethyl ether acetate (PGMEA) was added thereto to obtain a resin solution containing PGMEA as a solvent with a concentration of the solid component of 60 mass %. When the molecular weight of the resin in the resin solution was measured by GPC, the weight average molecular weight was 28,000 in terms of polystyrene. Then, 100 g of the resin solution was mixed with 9 g of a tetra-functional phenol compound, TEP-TPA (available from Asahi Organic Chemicals Industry Co., Ltd.), and 0.2 g of tetrahydrophthalic anhydride (RIKACID HH-A, available from New Japan Chemical Co., Ltd.). The solution was then filtered through a 1-µm membrane filter to obtain a resin solution (C-2).

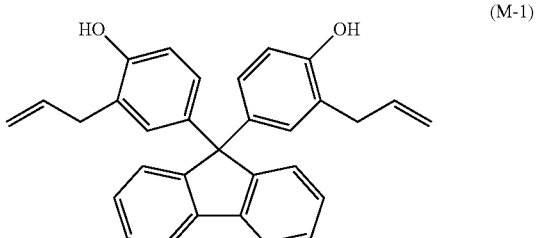

(M-1)

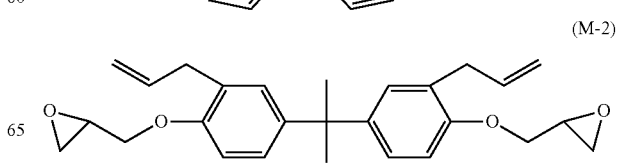

(M-2)

-continued

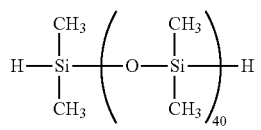

(M-3)

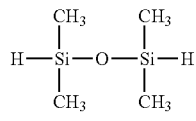

(M-4)

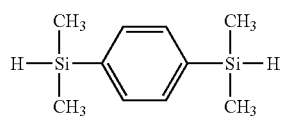

(M-5)

Resin Solution Production Example 1

24 g of a hydrogenated polystyrene-based thermoplastic resin, SEPTON4033 (available from Kuraray Co., Ltd.), was dissolved in 176 g of isononane to obtain an isononane solution containing 12 mass % SEPTON4033. The obtained solution was filtered through a 0.2-μm membrane filter to obtain an isononane solution of the non-silicone thermoplastic resin (A-1).

Resin Solution Production Example 2

To a solution consisting of 80 parts by mass of polydimethylsiloxane having 0.5 mol % vinyl groups at molecular side chains with a number average molecular weight (Mn) of 30,000, and 400 parts by mass of isododecane were added 3.0 parts of organohydrogenpolysiloxane shown by the formula (M-6) and 0.7 part of ethynylcyclohexanol, and then mixed. Furthermore, 0.5 part of a platinum catalyst CAT-PL-5 (available from Shin-Etsu Chemical Co., Ltd.) was added thereto, and the mixture was filtered through a 0.2-μm membrane filter to obtain a thermosetting siloxane polymer solution (B-1).

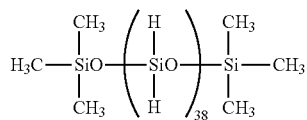

(M-6)

Resin Solution Production Example 3

To a solution consisting of 60 parts by mass of polydimethylsiloxane having 0.5 mol % vinyl groups at molecular side chains with a number average molecular weight (Mn) of 30,000, 20 parts by mass of polydimethylsiloxane having 0.15 mol % vinyl groups at both terminal chains with a number average molecular weight (Mn) of 60,000, and 400 parts by mass of isododecane were added 2.5 parts of organohydrogenpolysiloxane shown by the formula (M-6) and 0.7 part of ethynylcyclohexanol, and then mixed. Furthermore, 0.5 part of a platinum catalyst CAT-PL-5 (available from Shin-Etsu Chemical Co., Ltd.) was added thereto, and the mixture was filtered through a 0.2-μm membrane filter to obtain a thermosetting siloxane polymer solution (B-2).

Resin Solution Production Example 4

To a solution consisting of 80 parts by mass of polydimethylsiloxane having 5 mol % vinyl group at both terminals and side chain with a number average molecular weight (Mn) of 30,000, and 400 parts by mass of isododecane were added 7.5 parts of organohydrogenpolysiloxane shown by the formula (M-6) and 0.7 part of ethynylcyclohexanol, and then mixed. Furthermore, 0.5 part of a platinum catalyst CAT-PL-5 (available from Shin-Etsu Chemical Co., Ltd.) was added thereto, and the mixture was filtered through a 0.2-μm membrane filter to obtain a thermosetting siloxane polymer solution (B-3).

Comparative Synthesis Example 1

In a four-necked flask, 90 parts of a crude rubber state dimethylpolysiloxane shown by the formula (7) both molecular terminals of which are sealed with hydroxyl groups and a 30% toluene solution of which has a viscosity at 25° C. of 98,000 mPa·s, and 10 parts of methylpolysiloxane resin composed of 0.75 mol of $(CH_3)_3SiO_{1/2}$ unit and 1 mol of $SiO_{4/2}$ unit and containing 1.0 mol % of hydroxyl group per 100 parts of the solid component were dissolved in 900 parts of toluene. To the obtained solution was added 1 part of 28% aqueous ammonia, and the mixture was subjected to condensation reaction under stirring at room temperature for 24 hours. Then, the resulting mixture was heated to 180° C. under reduced pressure, and toluene, condensed water, ammonia, etc., were removed therefrom to obtain a solidified partially condensed product. 900 parts of toluene was added to 100 parts of the partially condensed product to dissolve the product. To the solution was added 20 parts of hexamethyldisilazane, and the mixture was stirred at 130° C. for 3 hours to seal the remaining hydroxyl groups. Subsequently, the mixture was heated to 180° C. under reduced pressure, and the solvent was removed to obtain a solidified non-reactive partially condensed product. Moreover, after adding 900 parts of hexane to 100 parts of the non-reactive partially condensed product to dissolve the product, this solution was added to 2000 parts of acetone, and the precipitated resin was collected. Thereafter, hexane, etc., were removed under vacuum to obtain a dimethylpolysiloxane polymer having a weight average molecular weight of 900,000 and containing 0.05 mass % of a low molecular weight component having a molecular weight of 740 or less.

20 g of this polymer was dissolved in 80 g of isododecan, and the solution was filtered through a 0.2-μm membrane filter to obtain an isododecane solution of the dimethylpolysiloxane polymer (D-1).

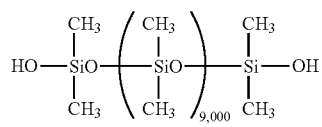

(7)

Examples 1-3 to Comparative Example 1

Onto a 200-mm diameter silicon wafer (thickness: 725 μm) whose entire surface was formed with copper posts having height of 10 μm and diameter of 40 μm, the material corresponding to the layer (A) was applied by spin coating, and then heated with a hot plate at 150° C. for 5 minutes to form a film having a thickness shown in Table 1 on the bump-formed surface of the wafer. On the other hand, the polymer solution corresponding to the layer (C) was likewise applied to a 200-mm diameter glass plate (thickness: 500 μm), which was used as the support, and then heated with a hot plate at 150° C. for 5 minutes to form a film with a thickness shown in Table 1 on the glass support. Then, the thermosetting siloxane polymer solution corresponding to the layer (B) was applied onto the layer (C) formed on the glass support by spin coating to form a film with a thickness shown in Table 1. The resultant was then heated on a hot plate at 150° C. for 3 minutes. In this manner, the silicon wafer having the non-silicone thermoplastic resin layer (A) and the glass plate having the layer (C) composed of the thermosetting siloxane-modified polymer layer and the layer (B) on the layer (C) thus obtained were bonded so that the resin surfaces faced each other in a vacuum bonding apparatus under conditions shown in Table 1. A wafer processing laminate was thereby manufactured.

In the above examples, the glass plate was used as the support for the purpose of visually observing abnormalities after bonding the substrate, but a silicon substrate such as a wafer, which does not transmit light, can be used instead.

Thereafter, the bonded substrate was subjected to the following tests. The results of Examples and Comparative Example are shown in Table 1. In addition, evaluations were carried out in order described below.

—Adhesion Test—

The 200-mm wafer was bonded by a wafer-bonding apparatus EVG520IS manufactured by EV group. The bonding was carried out at adhesion temperature shown in Table 1, under a chamber internal pressure during bonding of $10^{-3}$ mbar or less, with a load of 5 kN. After bonding, the substrate was once heated with an oven at 180° C. for 1 hour to cure the layer (B) and the layer (C). After the substrate was cooled to room temperature, adhesion state of its interface was visually observed. When no abnormality like bubbles was found at the interface, the laminate was evaluated as good, and shown with "good". When an abnormality was found, the laminate was evaluated as poor, and shown with "poor".

—Back Surface Grinding Resistance Test—

The back surface of the silicon wafer was ground by a grinder (DAG810, manufactured by DISCO Co., Ltd.) with a diamond grinding wheel. After the wafer was ground to a final substrate thickness of 50 μm, abnormalities such as crack and separation were checked with an optical microscope (100-folds). When no abnormality was found, the laminate was evaluated as good, and shown with "good". When an abnormality was found, the laminate was evaluated as poor, and shown with "poor".

—CVD Resistance Test—

After the back surface of the silicon wafer was ground, the processing laminate was put into a CVD apparatus and subjected to a test of forming a $SiO_2$ film 2 μm thick to check abnormalities in appearance at that time. When no appearance abnormality was found, the laminate was evaluated as good, and shown with "good". When voids, swelling of the wafer, breakage of the wafer, etc., were found, the laminate was evaluated as poor, and shown with "poor". The conditions of the CVD resistance test are as follows.

Apparatus: Plasma CVD PD270STL (manufactured by SAMCO Inc.)
RF: 500 W, internal pressure: 40 Pa
TEOS (tetraethyl orthosilicate): $O_2$=20 sccm:680 sccm —Separation Test—

Separation ability of the substrate was evaluated in the following manner. First, a dicing tape was bonded to the wafer side of the wafer processing laminate that had been thinned to 50 μm and subjected to the CVD resistance test, with a dicing frame. This dicing tape surface was set to a suction plate by vacuum suction. Then, one point of the glass was lifted by tweezers at room temperature to separate the glass substrate. When it could be separated without cracking the 50-μm wafer, the laminate was shown with "good". When an abnormality such as cracking occurred, the laminate was evaluated as poor, and shown with "poor".

—Cleaning Removability Test—

After the separation ability test, the 200-mm wafer (which had been exposed to the CVD resistance test condition) mounted on the dicing frame via the dicing tape was set on a spin coater with the adhesive layer upside. p-menthane was then sprayed as a cleaning solution for 5 minutes, and the wafer was rinsed by spraying isopropyl alcohol (IPA) while rotating the wafer. Thereafter, appearance of the wafer was observed to visually check residue of the adhesive material resin. When no resin remained, the laminate was evaluated as good, and shown with "good". When the resin remained, the laminate was evaluated as poor, and shown with "poor".

—Peeling Force Test—

Onto a 200-mm diameter silicon wafer (thickness: 725 μm), the material corresponding to the layer (A) was applied by spin coating, and then heated with a hot plate at 150° C. for 5 minutes to form a film having a thickness shown in Table 1 on the bump-formed surface of the wafer. Then, the thermosetting siloxane polymer solution corresponding to the layer (B) was applied onto the layer (A) formed on the silicon wafer by spin coating and heated on a hot plate at 150° C. for 3 minutes to form a film with a thickness of 2 μm. Furthermore, the polymer solution corresponding to the layer (C) was applied onto the layer (B) by spin coating and heated with a hot plate at 150° C. for 5 minutes to form a film having a thickness of 50 μm above the silicon wafer. Then, the layers were cured in an oven at 180° C. over 1 hour.

Then, five polyimide tapes with a length of 150 mm and a width of 25 mm were attached to the layer (C) on the wafer, and a part of the temporary adhesive layer to which no tape has been attached was removed. 120 mm of the tapes were then peeled off from one end by 180° peeling at a speed of 300 mm/minute with AUTOGRAPH (AG-1) manufactured by Shimadzu Co. (120 mm stroke, 5 times), and an average force applied at this time was measured as a peeling force of the temporary adhesive layer (B).

TABLE 1

|  | Example 1 | Example 2 | Example 3 | Comparative Example 1 |
|---|---|---|---|---|
| Resin layer (A) | A-1 | A-1 | A-1 | A-1 |
| Film thickness of layer (A) | 5 μm | 5 μm | 5 μm | 5 μm |
| Resin layer (B) | B-1 | B-2 | B-3 | D-1 |
| Film thickness of layer (B) | 5 μm | 10 μm | 15 μm | 2 μm |
| Peeling force of layer (B) | 5 gf | 10 gf | 30 gf | 5 gf |
| Resin layer (C) | C-1 | C-1 | C-2 | C-1 |
| Film thickness of layer (C) | 60 μm | 60 μm | 50 μm | 60 μm |

TABLE 1-continued

|  | Example 1 | Example 2 | Example 3 | Comparative Example 1 |
|---|---|---|---|---|
| Adhesion temperature | 120° C. | 120° C. | 140° C. | 120° C. |
| Adhesion | Good | Good | Good | Good |
| Back surface grinding resistance | Good | Good | Good | Good |
| CVD resistance | Good | Good | Good | Poor |
| Separation ability | Good | Good | Good | Good |
| Cleaning removability | Good | Good | Good | Good |

Table 1 shows that Examples 1 to 3, which satisfy the requirements of the present invention, facilitated temporary adhesion and separation, and was excellent particularly in CVD resistance. By contrast, Comparative Example 1, in which the layer (B) does not satisfy the requirements of the present invention, had poor CVD resistance.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A temporary adhesive material for a wafer processing, the temporary adhesive material being used for temporarily bonding a support and a wafer having a front surface on which a circuit is formed and a back surface to be processed, comprising:
a complex temporary adhesive material layer having a three-layered structure that includes a first temporary adhesive layer composed of a non-silicone thermoplastic resin layer (A) capable of releasably adhering to the front surface of the wafer, a second temporary adhesive layer composed of a thermosetting siloxane polymer layer (B) laminated on the first temporary adhesive layer, and a third temporary adhesive layer composed of a thermosetting siloxane-modified polymer layer (C) laminated on the second temporary adhesive layer and capable of releasably adhering to the support, wherein
the non-silicone thermoplastic resin layer (A) is an elastomer selected from the group consisting of an olefin type thermoplastic elastomer, a polybutadiene type thermoplastic elastomer, a styrene type thermoplastic elastomer, a styrene-butadiene type thermoplastic elastomer, and a styrene-polyolefin type thermoplastic elastomer,
the thermosetting siloxane polymer layer (B) is a cured layer of a composition containing:
(B-1) an organopolysiloxane having two or more alkenyl groups per molecule;
(B-2) an organohydrogenpolysiloxane having two or more silicon-bonded hydrogen atoms (Si—H groups) per molecule, in such an amount that a mole ratio of the Si—H group in the component (B-2) to the alkenyl group in the component (B-1) ranges from 0.3 to 10; and
(B-3) a platinum-based catalyst, and
the thermosetting siloxane-modified polymer layer (C) is a cured layer of a composition containing 100 parts by mass of a siloxane bond-containing polymer having a repeating unit shown by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

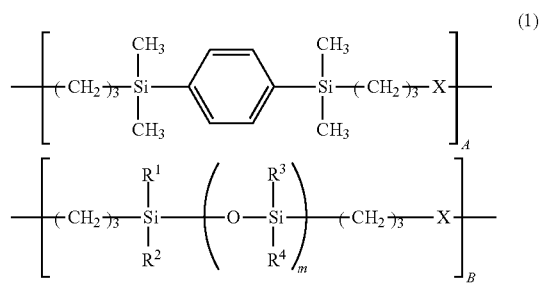

(1)

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and X is a divalent organic group shown by the following general formula (2),

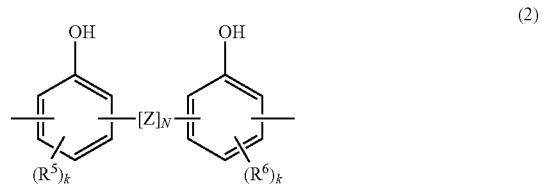

(2)

wherein Z represents a divalent organic group selected from any of

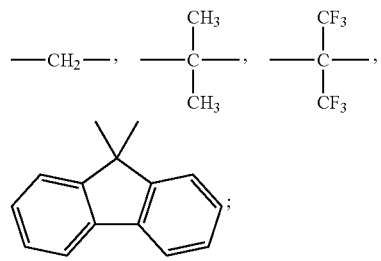

N represents 0 or 1; $R^5$ and $R^6$ each represent an alkyl or alkoxy group having 1 to 4 carbon atoms, and may be the same or different from each other; and "k" represents any of 0, 1, and 2.

2. The temporary adhesive material for a wafer processing according to claim 1, wherein the thermosetting siloxane polymer layer (B) further contains (B-4) a reaction retarder in an amount of 0.1 to 10 parts by mass based on 100 parts by mass of a total of the component (B-1) and the component (B-2).

3. The temporary adhesive material for a wafer processing according to claim 2, wherein the thermosetting siloxane polymer layer (B) exhibits a 180° peeling force of 2 gf to 50 gf after heat curing, the 180° peeling force being measured with a test piece having a width of 25 mm.

4. The temporary adhesive material for a wafer processing according to claim 1, wherein the thermosetting siloxane polymer layer (B) exhibits a 180° peeling force of 2 gf to 50 gf after heat curing, the 180° peeling force being measured with a test piece having a width of 25 mm.

5. A method for manufacturing a thin wafer, comprising the steps of:
   (a) bonding a support and a circuit-forming front surface of a wafer that has the circuit-forming front surface and a non-circuit-forming back surface through the complex temporary adhesive material layer used in the temporary adhesive material for a wafer processing according to claim 1, the complex temporary adhesive material layer including the non-silicone thermoplastic resin layer (A), the thermosetting siloxane polymer layer (B), and the thermosetting siloxane-modified polymer layer (C), wherein the bonding is performed by forming the thermosetting siloxane-modified polymer layer (C) on the support, forming the thermosetting siloxane polymer layer (B) on the polymer layer (C), and then bonding the support, on which the polymer layers (C) and (B) have been formed, to the wafer on which a circuit and the polymer layer (A) have been formed, under vacuum;
   (b) heat curing the polymer layers (B) and (C);
   (c) grinding or polishing the non-circuit-forming back surface of the wafer bonded to the support;
   (d) processing the non-circuit-forming back surface of the wafer; and
   (e) separating the processed wafer from the support.

6. The temporary adhesive material for a wafer processing according to claim 1, wherein the complex temporary adhesive material layer having a three-layered structure consists of the non-silicone thermoplastic resin layer (A), the thermosetting siloxane polymer layer (B), and the thermosetting siloxane-modified polymer layer (C).

7. The temporary adhesive material for a wafer processing according to claim 1, wherein the thermoplastic resin composing the non-silicone thermoplastic resin layer (A) is a hydrogenated polystyrene type elastomer.

8. A temporary adhesive material for a wafer processing, the temporary adhesive material being used for temporarily bonding a support and a wafer having a front surface on which a circuit is formed and a back surface to be processed, comprising:
   a complex temporary adhesive material layer having a three-layered structure that includes a first temporary adhesive layer composed of a non-silicone thermoplastic resin layer (A) capable of releasably adhering to the front surface of the wafer, a second temporary adhesive layer composed of a thermosetting siloxane polymer layer (B) laminated on the first temporary adhesive layer, and a third temporary adhesive layer composed of a thermosetting siloxane-modified polymer layer (C) laminated on the second temporary adhesive layer and capable of releasably adhering to the support, wherein
   the non-silicone thermoplastic resin layer (A) is an elastomer selected from the group consisting of an olefin type thermoplastic elastomer, a polybutadiene type thermoplastic elastomer, a styrene type thermoplastic elastomer, a styrene-butadiene type thermoplastic elastomer, and a styrene-polyolefin type thermoplastic elastomer,
   the thermosetting siloxane polymer layer (B) is a cured layer of a composition containing:
   (B-1) an organopolysiloxane having two or more alkenyl groups per molecule;
   (B-2) an organohydrogenpolysiloxane having two or more silicon-bonded hydrogen atoms (Si—H groups) per molecule, in such an amount that a mole ratio of the Si—H group in the component (B-2) to the alkenyl group in the component (B-1) ranges from 0.3 to 10; and
   (B-3) a platinum-based catalyst, and
   the thermosetting siloxane-modified polymer layer (C) is a cured layer of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

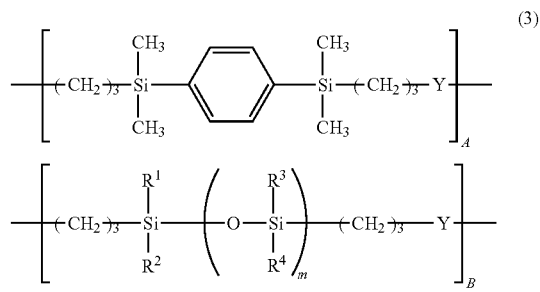

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and Y is a divalent organic group shown by the following general formula (4),

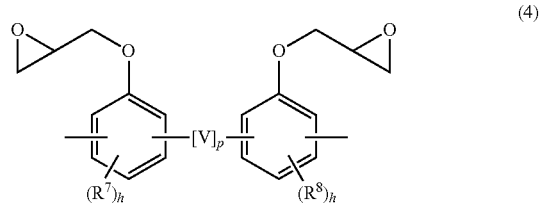

wherein V represents a divalent organic group selected from any of

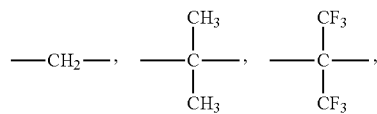

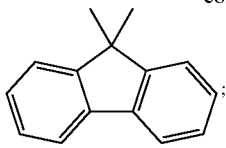

"p" represents 0 or 1; $R^7$ and $R^8$ each represent an alkyl or alkoxy group having 1 to 4 carbon atoms, and may be the same or different from each other; and "h" represents any of 0, 1, and 2.

9. A wafer processing laminate comprising a support, a temporary adhesive material layer formed on the support, and a wafer stacked on the temporary adhesive material layer, the wafer having a front surface on which a circuit is formed and a back surface to be processed, wherein
the temporary adhesive material layer comprises a complex temporary adhesive material layer having a three-layered structure that includes a first temporary adhesive layer composed of a non-silicone thermoplastic resin layer (A) releasably adhering to the front surface of the wafer, a second temporary adhesive layer composed of a thermosetting siloxane polymer layer (B) laminated on the first temporary adhesive layer, and a third temporary adhesive layer composed of a thermosetting siloxane-modified polymer layer (C) laminated on the second temporary adhesive layer and releasably adhering to the support, and wherein
the non-silicone thermoplastic resin layer (A) is an elastomer selected from the group consisting of an olefin type thermoplastic elastomer, a polybutadiene type thermoplastic elastomer, a styrene type thermoplastic elastomer, a styrene-butadiene type thermoplastic elastomer, and a styrene-polyolefin type thermoplastic elastomer,
the thermosetting siloxane polymer layer (B) is a cured layer of a composition containing:
(B-1) an organopolysiloxane having two or more alkenyl groups per molecule;
(B-2) an organohydrogenpolysiloxane having two or more silicon-bonded hydrogen atoms (Si—H groups) per molecule, in such an amount that a mole ratio of the Si—H group in the component (B-2) to the alkenyl group in the component (B-1) ranges from 0.3 to 10; and
(B-3) a platinum-based catalyst, and
the thermosetting siloxane-modified polymer layer (C) is a cured layer of a composition containing 100 parts by mass of a siloxane bond-containing polymer having a repeating unit shown by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

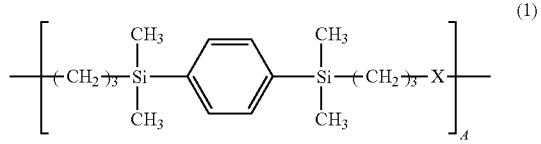 (1)

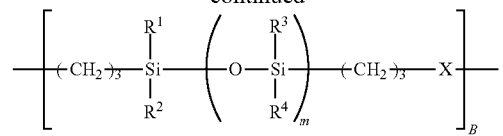

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and X is a divalent organic group shown by the following general formula (2),

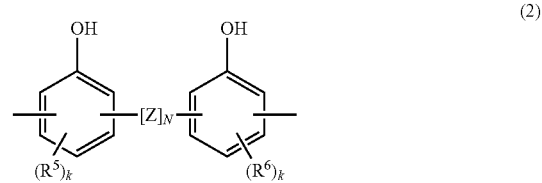 (2)

wherein Z represents a divalent organic group selected from any of

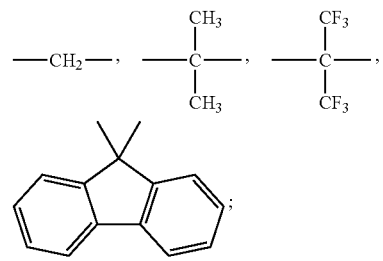

N represents 0 or 1; $R^5$ and $R^6$ each represent an alkyl or alkoxy group having 1 to 4 carbon atoms, and may be the same or different from each other; and "k" represents any of 0, 1, and 2.

10. The wafer processing laminate according to claim 9, wherein the thermosetting siloxane polymer layer (B) further contains (B-4) a reaction retarder in an amount of 0.1 to 10 parts by mass based on 100 parts by mass of a total of the component (B-1) and the component (B-2).

11. The wafer processing laminate according to claim 10, wherein the thermosetting siloxane polymer layer (B) exhibits a 180° peeling force of 2 gf to 50 gf after heat curing, the 180° peeling force being measured with a test piece having a width of 25 mm.

12. The wafer processing laminate according to claim 9, wherein the thermosetting siloxane polymer layer (B) exhibits a 180° peeling force of 2 gf to 50 gf after heat curing, the 180° peeling force being measured with a test piece having a width of 25 mm.

13. The wafer processing laminate according to claim 9, wherein the complex temporary adhesive material layer having a three-layered structure consists of the non-silicone thermoplastic resin layer (A), the thermosetting siloxane polymer layer (B), and the thermosetting siloxane-modified polymer layer (C).

14. The wafer processing laminate according to claim 9, wherein the non-silicone thermoplastic resin layer (A) is a hydrogenated polystyrene type elastomer.

15. A wafer processing laminate comprising a support, a temporary adhesive material layer formed on the support, and a wafer stacked on the temporary adhesive material layer, the wafer having a front surface on which a circuit is formed and a back surface to be processed, wherein the temporary adhesive material layer comprises a complex temporary adhesive material layer having a three-layered structure that includes a first temporary adhesive layer composed of anon-silicone thermoplastic resin layer (A) releasably adhering to the front surface of the wafer, a second temporary adhesive layer composed of a thermosetting siloxane polymer layer (B) laminated on the first temporary adhesive layer, and a third temporary adhesive layer composed of a thermosetting siloxane-modified polymer layer (C) laminated on the second temporary adhesive layer and releasably adhering to the support, and wherein the non-silicone thermoplastic resin layer (A) is an elastomer selected from the group consisting of an olefin type thermoplastic elastomer, a polybutadiene type thermoplastic elastomer, a styrene type thermoplastic elastomer, a styrene-butadiene type thermoplastic elastomer, and a styrene-polyolefin type thermoplastic elastomer, the thermosetting siloxane polymer layer (B) is a cured layer of a composition containing:

(B-1) an organopolysiloxane having two or more alkenyl groups per molecule;

(B-2) an organohydrogenpolysiloxane having two or more silicon-bonded hydrogen atoms (Si—H groups) per molecule, in such an amount that a mole ratio of the Si—H group in the component (B-2) to the alkenyl group in the component (B-1) ranges from 0.3 to 10; and (B-3) a platinum-based catalyst, and the thermosetting siloxane-modified polymer layer (C) is a cured layer of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

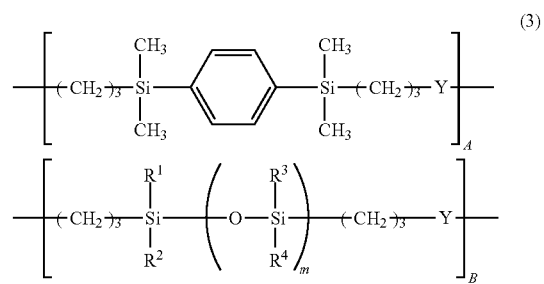

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and Y is a divalent organic group shown by the following general formula (4),

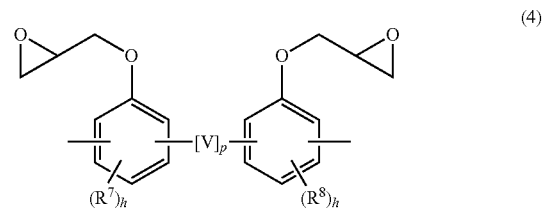

wherein V represents a divalent organic group selected from any of

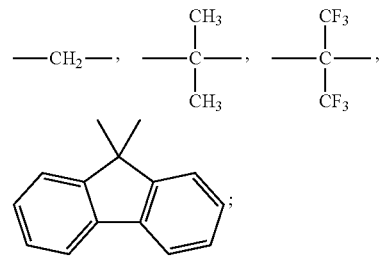

"p" represents 0 or 1; $R^7$ and $R^8$ each represent an alkyl or alkoxy group having 1 to 4 carbon atoms, and may be the same or different from each other; and "h" represents any of 0, 1, and 2.

* * * * *